United States Patent

Shibata et al.

[11] Patent Number: 5,973,960
[45] Date of Patent: Oct. 26, 1999

[54] NONVOLATILE SEMICONDUCTOR MEMORY DEVICE CAPABLE OF STORING ANALOG OR MANY-VALUED DATA AT HIGH SPEED AND WITH A HIGH DEGREE OF ACCURACY

[75] Inventors: Tadashi Shibata; Tadahiro Ohmi; Yuichiro Yamashita, all of Miyagi-ken, Japan

[73] Assignee: Tadahiro OHMI and Tadashi Shibata, Botho of Miyagi, Japan

[21] Appl. No.: 08/930,373

[22] PCT Filed: Apr. 1, 1996

[86] PCT No.: PCT/JP96/00884

§ 371 Date: Feb. 9, 1998

§ 102(e) Date: Feb. 9, 1998

[87] PCT Pub. No.: WO96/30948

PCT Pub. Date: Oct. 3, 1996

[30] Foreign Application Priority Data

Mar. 31, 1995 [JP] Japan ................................... 7/76929

[51] Int. Cl.$^6$ ................................................ G11C 14/00
[52] U.S. Cl. ............................ 365/185.08; 365/185.03; 257/316
[58] Field of Search .................... 365/185.08, 185.03; 257/316

[56] References Cited

U.S. PATENT DOCUMENTS 5,065,366  11/1991  Bennett et al. ......................... 365/185
5,450,354  9/1995  Sawada et al. ......................... 365/185
5,559,736  9/1996  Matsukawa et al. ............... 365/185.24

FOREIGN PATENT DOCUMENTS 2-35781  2/1990  Japan ........................... H01L 29/788

*Primary Examiner*—David Nelms
*Assistant Examiner*—Tuan T. Nguyen
*Attorney, Agent, or Firm*—Randall J. Knuth

[57] ABSTRACT

A nonvolatile semiconductor memory which is capable of a high degree of integration and can conduct the writing of analog data at high speed and with a high degree of accuracy.

The memory device comprises two or more semiconductor devices comprising a first MOS transistor having a first floating gate which is electrically insulated, a first electrode which is capacitively coupled with the first floating gate, a second electrode provided with the first floating gate via a tunnel junction, and a third electrode connected to the second electrode via a switch; the present invention is further provided with a fourth electrode connected commonly with the third electrodes of the semiconductor devices, a fifth electrode connected commonly with the source electrodes of the first MOS transistors, a sixth electrode which is capacitively coupled with the fourth electrode, and a seventh electrode which is connected with the fourth electrode via a switch.

40 Claims, 11 Drawing Sheets

NONVOLATILE SEMICONDUCTOR MEMORY DEVICE CAPABLE OF STORING ANALOG OR MANY-VALUED DATA AT HIGH SPEED AND WITH A HIGH DEGREE OF ACCURACY

BACKGROUND OF THE INVENTION

1. Field of the Invention

The present invention relates to a nonvolatile semiconductor memory device, and in particular, relates to a memory device which is capable of storing analog or many-valued data at high speed and with a high degree of accuracy.

2. Description of the Related Art

In recent years, in concert with the development in computer technology, the progress in the field of data processing technology has been truly remarkable. However, when attempts were made to realize the flexible type of data processing conducted by human beings, it was almost impossible to obtain the results of such calculations in real time using present computers. The reasons advanced for this are that the data which human beings process in the course of their daily lives are analog data, so that there is firstly an enormous amount of such data, and moreover, these data are inexact and vague. It is thus a problem in present data processing systems that the extremely redundant analog data are all converted into digital values, and rigorous digital operations are conducted one by one.

An example of this is image data. For example, if one screen is incorporated into a 500×500 two dimensional array, then the total number of pixels is 250,000, and when the strength of the three colors red, green, and blue for each pixel is expressed in terms of eight bits, then the amount of data in one stationary image reaches 750,000 bits. In moving images, the amount of image data increases with time. Even if a present day supercomputer is used, it is impossible to manipulate the large amount of (1)/(0) data and conduct picture recognition and understanding in real time.

On the other hand, attempts have been made to realize data processing approximating that of human beings by accepting real world data, which are analog values, in an unchanged form and conducting calculations and processing on these analog values, in order to overcome the problems described above. As a result, a number of memory devices have been invented.

As one of these devices, the present inventors have proposed, in Japanese Patent Application No. Hei 7-2944, a memory device which is capable of writing desired analog values using simple circuitry such as that shown in FIG. 9 (title of the invention: Nonvolatile semiconductor Memory, date of application: Jan. 11, 1995). First an explanation of the cell of this technology will be made.

Reference 901 indicates an NMOS transistor, while reference 902 indicates a floating gate formed from, for example, N⁺ polysilicon; this controls the ON and OFF state of NMOS 901. NMOS drain 903 is connected to power source line 904, while source 905 is connected to an external capacity load 906; the structure is such that the circuit operates as a source follower circuit and reads out a potential $V_{FG}$ of the floating gate 902 to the exterior as $V_{OUT}$. Reference 907 indicates an electrode which is capacitively coupled with floating gate 902; in this example, it is grounded. The capacitive coupling coefficient thereof is represented by $C_1$. Reference 908 indicates a charge transfer electrode; it is connected with the floating gate via a tunnel junction 909 which is an oxide film of approximately 10 nm.

The capacitance of this tunnel junction 909 is represented by $C_2$. Charge transfer electrode 908 is connected to writing high voltage application electrode 911 via a capacitance 910 (the size thereof is represented by $C_3$). Reference 912 indicates an NMOS transistor; the ON and OFF state thereof is controlled by the output line 913 of the inverter. NMOS transistor 914 serves to connect the input 915 of a control circuit constructed using an inverter to a memory cell. The input 915 of the control circuit is capacitively coupled with input of inverter 916, and the input of inverter 916 and output 917 are connected via NMOS transistor 918. Output 917 controls the ON and OFF state of NMOS transistor 912 via a further stage inverter.

The readout principle is simple; NMOS 914 is placed in an OFF state, and the memory cell is cut off from the control circuit, and transistor 901 is then conducts a source follower operation in the state in which electrode 911 is grounded, and the contents of the floating gate are read out as an analog value.

The writing principle will next be explained. During writing, after a reference value is first inputted into input 915 of the control circuit, NMOS transistor 918 is first turned ON and is then turned OFF, and the reference value is stored in the input portion of inverter 916, which has been placed in a floating state, as a charge, and next, when the reference value is inputted into the control circuit, the control circuit outputs the power source voltage to the output line 913. This reference value represents the addition of an offset voltage to the voltage of the data which are to be written, and since the offset voltage has a value particular to each circuit, the reference value is easy to determine.

Next, NMOS 914 is placed in an ON state so that the control circuit may monitor the output of the source follower. After this, a high voltage of approximately 20 V is applied to electrode 911, a strong electric field is produced in the tunnel junction 909, and a Fowler-Nordheim current is caused to flow. The electrons are drawn from the floating gate and writing commences, and the voltage of the floating gate during this writing is inputted into the control circuit via transistor 901 during the source follower operation. When the output of the source follower has become equal to the reference value, the power source voltage is outputted to the output line of the control circuit and transistor 912, which was in an OFF state, is allowed to conduct. When this is done, electrode 908 is discharged, the strong electric field generated in tunnel junction 909 disappears, and writing is completed. At this time, the voltage of the object data is written into the floating gate.

Furthermore, a variety of circuit structures are employed as the control circuit, and only one example thereof is discussed here.

FIG. 10 is a circuit diagram showing a plurality of such cells arranged so as to form an actual memory. The circuit shown in FIG. 9 is employed in an unchanged manner as the control circuit. Of course, other circuits maybe employed in some cases.

The reason that a plurality of cells need to be arranged in this way is so that writing may be conducted in such a manner that only the cell into which writing is to be conducted is selected. References 1001, 1002, and 1003 are writing high voltage application electrodes of the cells, respectively, while references 1004, 1005, and 1006 are NMOS transistors used for reading selection. In writing selection, a high voltage is applied only to the writing voltage application electrode of the cell into which writing is to be conducted, while the electrodes of other cells are set to the ground potential, and only the reading selection transistor of the cell into which writing is conducted is placed in an ON state, so that the control circuit may monitor only the contents of the cell into which writing is to be conducted. By proceeding in this manner, it is possible to cause a tunnel current to flow only in the cell in which writing is to be conducted, and it is possible to read out the state of only that cell into which writing is conducted to the control circuit.

This memory realizes accurate writing with simple control circuitry; in addition, there is sufficient selectively in writing and reading, although there is a problem in that the degree of integration does not increase.

The reason for this is as given below.

$C_2$ represents the capacitance formed in the tunnel oxide film and since an extremely thin oxide film is employed, although this capacitance becomes rather large, it is necessary to set $C_1$ and $C_3$ so as to be larger than $C_2$. The reasons that the design must be accomplished in this manner are as follows:

(1) In order to apply a large voltage to $C_2$, it is necessary that $C_2$ be shown to be small in comparison with $C_3$ and $C_1$;

(2) $C_1$ must be made large in comparison with $C_2$ and $C_3$ in order to suppress the rise in voltage in the floating gate resulting from capacitive coupling when a high voltage is applied during writing;

(3) It is necessary to set the value of $C_3$ so as to be considerably larger than the sum of $C_1$ and $C_2$ in order to reduce the voltage drop across $C_2$ resulting from the movement of charge during writing. As an example, appropriate examples are $C_1:C_2: C_3=5:1: 25$. At this time, the size of the tunnel oxide film is set to 1.5 $\mu$m on a side and the thickness thereof is set to 10 nm, and if $C_1$ is formed between the substrate and the first polysilicon layer, then the thickness of the oxide film between these is 50 nm, and the area is 7 $\mu m^2$, while 16 $\mu m^2$ is necessary for $C_3$. In a structure in which this type of conventional cell is employed, a large capacitance load such as $C_3$ is provided for each cell as shown in FIG. 10 and this is undesirable. It is clear that as a result of this capacitance alone, the size is not different from present DRAM or EEPROM, so that the degree of integration does not increase.

Furthermore, attempts have been made to omit output selection transistors such as 1004, 1005, and 1006 in order to further reduce the number of elements. At this time, when power sources 1007, 1008, and 1009 are all in operation, output line 1010 is set to the maximum value maintained by the floating gate at all times, and selectivity is lost with respect to reading and with respect to the cell which is monitored during writing. Furthermore, if only the power line of the cell which is to be operated is set to the power source voltage, and only one cell is read out, as a result of the voltage rise of voltage line 1010, the power source side of cells which are not to be read out becomes the source, and in this state, they enter an ON state, and this is undesirable. The source follower transistors of the cells which are to be read out also include these and charging is necessary, so that this leads to a decline in the read out speed.

Accordingly, stratagems are necessary to reduce the number of elements.

FIG. 11 shows a circuit in which the outputs of the cell group shown in FIG. 10 are connected one by one to source follower buffer circuits having a CMOS structure. During actual use as a memory, it is necessary that the memory data be conveyed as far as the operating portions, so that the source follower of the cells must drive comparatively long wiring. For this reason, it was necessary to connect buffer circuits such as those conventionally employed to the memory output portions, as shown by 1101, 1102, and 1103; however, the attachment of buffer circuits to each of the memory outputs further increases the number of elements required for a memory cell, and thus an increase in the degree of integration can be anticipated. Furthermore, as a result of variation in the buffer, or the thermal characteristics of the MOS threshold, there were cases in which an accurate readout could not be conducted.

The present invention was created in light of the above circumstances; it has as an object thereof to provide a nonvolatile semiconductor memory which is capable of a high degree of integration and can conduct the writing of analog data at high speed and with a high degree of accuracy.

SUMMARY OF THE INVENTION

The present invention is provided with two or more semiconductor devices comprising a first MOS transistor having a first floating gate which is electrically insulated, a first electrode which is capacitively coupled with the first floating gate, a second electrode provided with the first floating gate via a tunnel junction, and a third electrode connected to the second electrode via a switch; the present invention is further provided with a fourth electrode connected commonly with the third electrodes of the semiconductor devices, a fifth electrode connected commonly with the source electrodes of the first MOS transistors, a sixth electrode which is capacitively coupled with the fourth electrode, and a seventh electrode which is connected with the fourth electrode via a switch.

In the present invention, capacitances or transistors, one of which was conventionally required for each memory cell, are externally provided, and the like, and thereby savings is achieved, and by means of this, it is possible to increase the degree of integration compared with the conventional case.

BRIEF DESCRIPTION OF THE DRAWINGS

The above-mentioned and other features and advantages of this invention, and the manner of attaining them, will become more apparent and the invention will be better understood by reference to the following description of an embodiment of the invention taken in conjunction with the accompanying drawings, wherein.

Corresponding reference characters indicate corresponding parts throughout the several views. The exemplification set out herein illustrates one preferred embodiment of the invention, in one form, and such exemplification is not to be construed as limiting the scope of the invention in any manner.

DETAILED DESCRIPTION OF THE INVENTION

Hereinbelow, embodiments of the present invention will be explained using the figures.

First Embodiment

Figure 1:
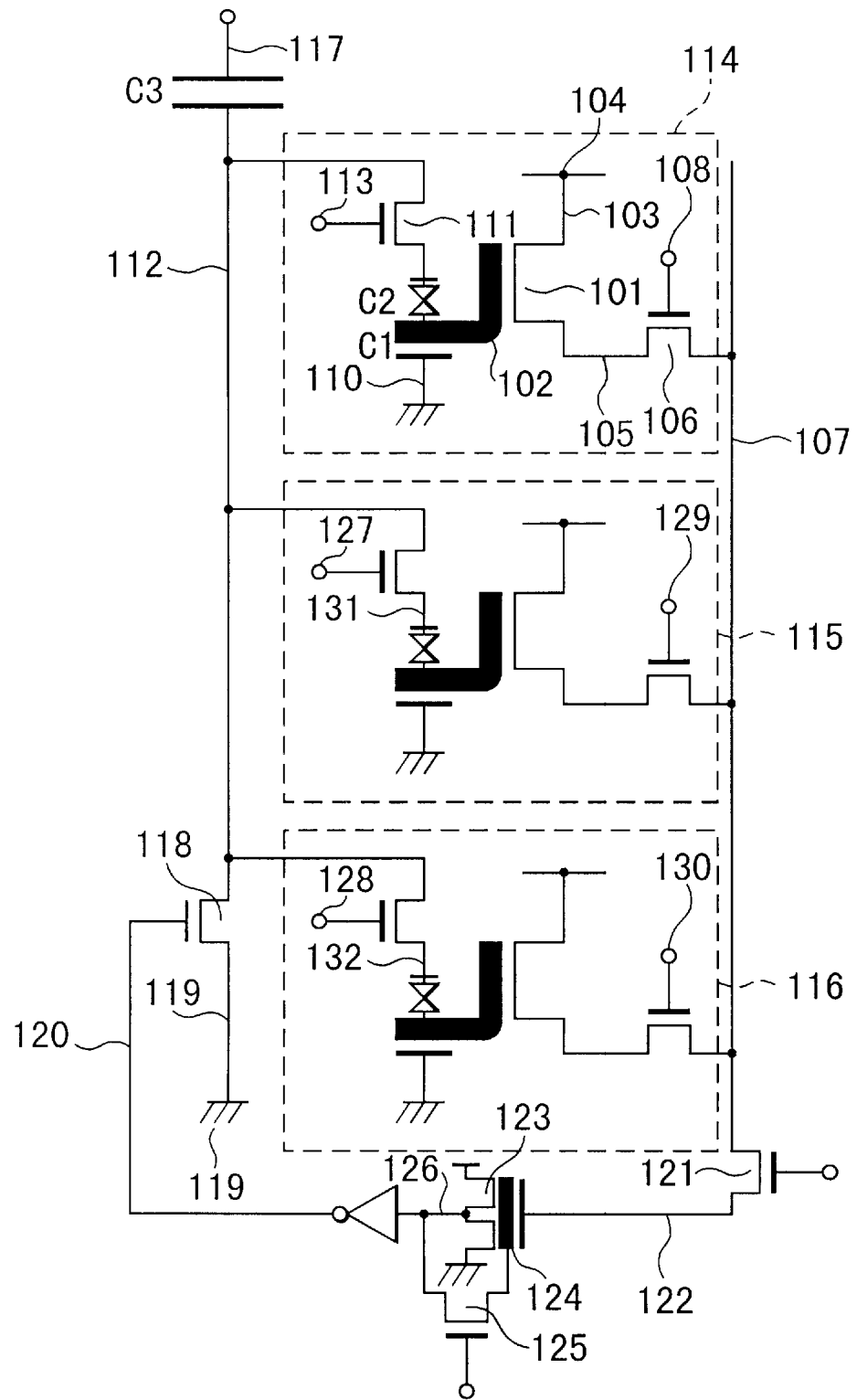
FIG. 1 is a circuit diagram relating to a first embodiment.

FIG. 1 is a circuit diagram showing a first embodiment. Reference 101 indicates an NMOS transistor, while reference 102 indicates a floating gate electrode which is formed from, for example, N$^+$ polysilicon; this controls the ON and OFF state of NMOS 101. The drain 103 of the NMOS is connected to the power source line 104, and source 105 is connected to a drain of NMOS transistor 106, while the source of transistor 106 is connected to the common readout voltage line 107. Additionally, electrode 108 is the gate electrode of transistor 106. The threshold voltage of transistor 106 is represented by $V_{FG1}$, and this is termed the readout selection transistor. Reference 110 indicates an electrode which is capacitively coupled with the floating gate, and the capacitance coefficient thereof is $C_1$; the potential thereof is set to the ground potential. Reference 111 indicates an NMOS transistor; the source electrode thereof is capacitively coupled to a floating gate 102 via a tunnel oxide film, and the capacitance coefficient thereof is represented by $C_2$. The drain transistor 111 is connected to a common writing voltage generating line 112, and reference 113 indicates the gate electrode of transistor 111. The threshold voltage of this transistor 111 is represented $V_{FG2}$ and this is termed a writing selection transistor. The structure described above forms one memory cell and a single analog value is stored therein. The various cells are labeled 114, 115, and 116 from the top of the figure.

In this way, a plurality of identically structured memory cells are collected, and the structure is such that the source electrode of the readout selection transistor of each cell is connected to the common readout voltage line 107. Furthermore, the drain of the writing selection transistor of each cell is connected to the common writing voltage generating line 112. Reference 117 is an electrode which is capacitively coupled with the writing voltage generating line 112, and the capacitive coupling coefficient thereof is represented by $C_3$. Furthermore, the common writing voltage generating line 112 is connected with the drain of a normally-OFF type NMOS transistor 118, and the source electrode of transistor 118 is grounded. Additionally, this has a gate electrode 120, and the threshold voltage thereof is represented by $V_{FG3}$. Voltage line 107 is connected with the input electrode 122 of a control circuit via NMOS transistor 121. The input electrode 122 is capacitively coupled with input 124 of inverter 123, and furthermore, input 124 is connected with the output 126 of inverter 123 via NMOS transistor 125. The output thereof is connected with gate electrode 120 of transistor 118 via another inverter.

Here, N channel transistors are used for all transistors; however, even if the specified transistors are replaced with P channel MOS transistors, there will be no change whatsoever in the effects of the present invention, and furthermore, in FIG. 1, three memory cells are arranged to form one block; however, this was done in order to fit the diagram on the paper, and it is of course the case that the effects of the present invention may be obtained when any number of memory cells greater than one is employed. Furthermore, in order to simplify the explanation, the gate electrodes of the writing selection transistors, and the gate electrodes of the readout selection transistors, of the memory cells which were not assigned a number are assigned the numbers 127, 128, 129, and 130 and the numbers 131 and 132 are assigned to the tunnel transfer ports thereof. Electrodes 110 and 118 were set to the ground potentials; however, this value is not necessarily so restricted, and if a freely selected value is applied, this may be used as a standard, and the other voltages may be adjusted accordingly.

Next, the basic operational principle of the circuit will be explained. Here, the case will be considered in which a voltage $V_{TAR}$ is written into only memory cell 114.

$V_{REF}$ is inputted into the control circuit, a single one of which is provided externally, as a reference voltage. After this, transistor 105 is placed in an ON state, and is then placed in an OFF state. When this is done, the circuit stores the reference voltage, and next, when a value equivalent to the reference is inputted, the circuit outputs the power source voltage to gate 120. This value $V_{REF}$ is the value which is outputted during writing when only $V_{TAR}$ is written into the memory cell; the value thereof represents the addition of an offset voltage to $V_{TAR}$. Since this offset value is determined by the design, it is a simple matter to obtain $V_{REF}$ from $V_{TAR}$. Furthermore, a value greater than or equal to threshold voltage $V_{FG1}$ is applied to electrode 108, while a voltage less than or equal to threshold voltage $V_{FG1}$ is applied to electrodes 129 and 130. When this is done, it is possible to read out only the contents of the memory cell which is the object of the writing operation to the common readout voltage 107.

A value greater than or equal to threshold voltage $V_{FG2}$ is inputted into electrode 113, while a value less than or equal to threshold voltage $V_{FG2}$ is inputted into electrodes 127 and 128. Furthermore, the potential of common writing voltage generating line 112 is set to the ground potential. By means of preceding in this manner, the tunnel transfer electrodes 131 and 132 of memory cells 115 and 116 store a charge such that they are always at the ground potential, and after this, even if the potential of common writing voltage generating line 112 changes, the potential of electrodes 131 and 132 does not change.

Next, after transistor 121 has been allowed to conduct, a sufficiently high voltage is applied to electrode 117. This value is approximately the value which allows a sufficient current to flow to the tunnel junction of the memory cell during writing. By proceeding in this manner, a current flows to the tunnel junction of memory cell 114, electrons are drawn from floating gate 102, and the potential of the floating gate continues to increase. The value of this voltage is read out to the input 122 of the control circuit from the transistor 101 which has a source follower structure through the readout selection transistor. During the process of writing in this cell, with respect to the other memory cells, a value less than or equal to $V_{FG2}$ is applied to electrodes 127 and 128 50 that the writing selection transistors thereof are in an OFF state, and the tunnel transfer electrodes are in the previous state, that is to say, they store the ground potential. That is to say, if attempts are made to conduct writing into memory cell 114, writing is not conducted into cells 115 and 116. It can be seen from this that writing is selectively conducted. When writing has been conducted for a certain amount of time and $V_{TAR}$ is written, the memory cell output $V_{REF}$ at this time.

The values are monitored when necessary by the control circuit, and when $V_{REF}$ is outputted, the control circuit outputs the power source voltage, and a voltage greater than the threshold voltage is applied to gate electrode 120. When this is done, transistor 118 enters an ON state, and the common writing voltage generating line is discharged, and reaches the ground potential. At this point, the writing is completed.

Furthermore, with respect to the selectivity during readout, this can be easily accomplished by means of controlling the ON and OFF state of each readout selection transistor.

The effects of using this circuit structure are clear. Conventionally, it was necessary that the capacitance $C_3$ be larger than the other capacitances $C_1$ and $C_2$; however, only one such capacitance $C_3$ was provided per block, and a writing selection transistor was used for each cell, and thereby, it was possible to realize a great increase in the degree of integration without sacrificing selectivity during writing or readout. The number of transistors was also much less than the conventional example; three transistors were used per cell.

Furthermore, in the present embodiment, a control circuit was employed in which a switch was provided for short circuiting the output and input of the inverter; however, there will be absolutely no change in the effects of the present invention even if other control circuits which were conventionally employed are used. This is because the effect of the present invention is an increase in integration resulting from making common elements possessed by a number of cells; this effect does not depend on the structure of the control circuit.

Second Embodiment

Figure 2:
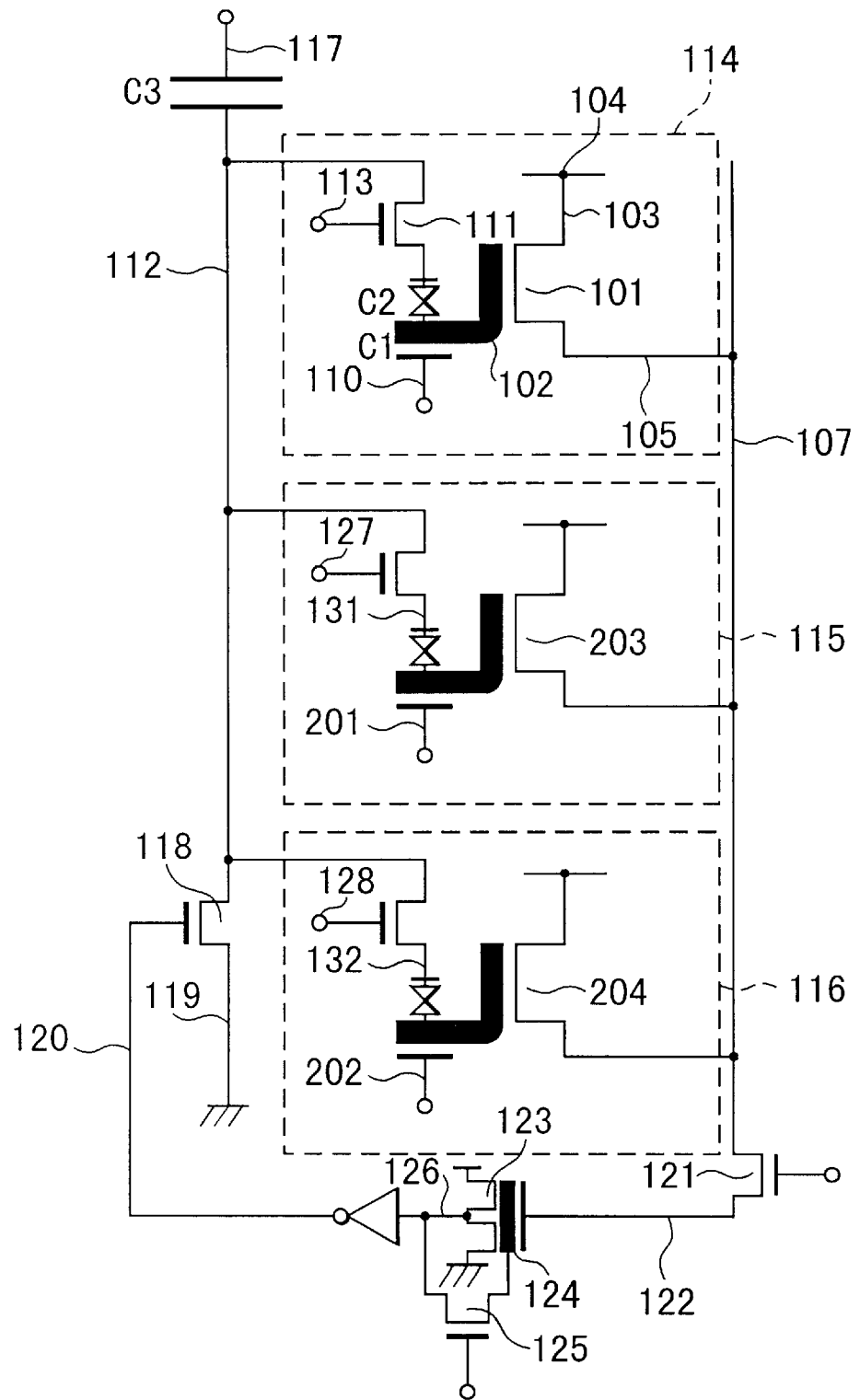
FIG. 2 is a circuit diagram relating to a second embodiment.

FIG. 2 shows a second embodiment. The points of difference between this embodiment and the first embodiment are that the readout selection transistors, one of which was provided for each cell, are eliminated, and furthermore, the potential of the electrode 110, which was fixed at the ground potential in the first embodiment, is made variable. Furthermore, the identical electrodes of the other memory cells are assigned the numbers 201 and 202, while NMOS transistors controlled by the floating gate 102 of the other transistors are assigned the numbers 203 and 204.

The operation of this circuit will be explained. Now, the case will be considered in which a voltage $V_{TAR}$ is written only into memory cell 114.

First, $V_{REF}$ is stored in an external control circuit as a reference voltage. Furthermore, a value greater than or equal to threshold voltage $V_{FG1}$ is applied to electrode 113, while a value less than or equal to threshold voltage $V_{FG1}$ is applied to electrodes 127 and 128, and writing only into cell 114 is made possible. Next, 0 V is applied to the electrode 110 of the cell into which writing is to be conducted, and a certain negative voltage is applied to the electrodes 201 and 202 of the other cells. With respect to the actual value of this negative voltage, any value may be stored in the floating gate; however, this should be a voltage which will definitely place transistors 203 and 204 in an OFF state. By proceeding in this manner, the values in the floating gates of the cells other than memory cell 114 are not read out to the common readout power source line, and only the cell which is the object of writing can be monitored. If only the cell into which writing is to be conducted can be monitored, writing can be conducted by a mechanism similar to that of the first embodiment by reading out this value to the control circuit.

The writing is thus completed; and when only readout is to be conducted, as well, by applying a voltage of 0 V to the cell which is to be read out, while applying a negative voltage to the cells which are not to be read out, it is possible to select only that cell which is to read out.

In this manner, in the second embodiment, by applying a negative voltage to the floating gate via capacitive coupling, it is possible to omit the readout selection transistors, and thus to realize a further reduction in the number of elements.

Third Embodiment

Figure 3:
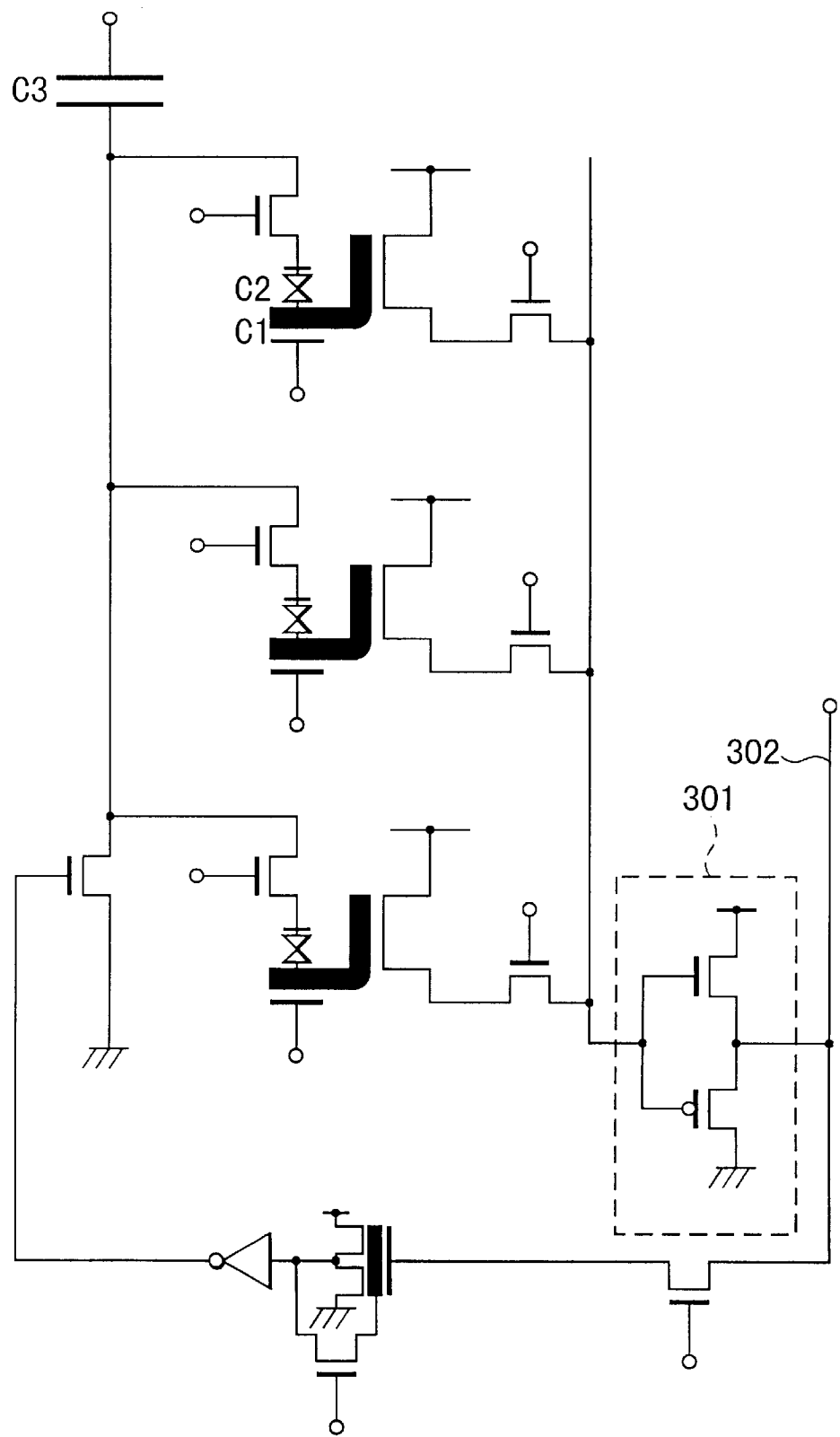
FIG. 3 is a circuit diagram relating to a third embodiment.

FIG. 3 shows a third embodiment. The points of difference are that a source follower buffer 301 having a CMOS structure is connected to the common readout voltage line of the first embodiment, and the output 302 thereof forms the common readout voltage terminal of the data.

The operation of this circuit will be explained. Selective writing is conducted in the same manner as in the first embodiment. The point of difference is that the voltage value which passes through the buffer is sent to the control circuit during writing, and for this reason, the correct value, which has absorbed the dislocation during the manufacturing of the buffer, is written into the memory cell. For this reason, even if the characteristics of the buffer become aberrant, a correct value will be written without being affected thereby.

The selective readout is conducted in the same manner as the first embodiment. The difference is that a buffer is connected to the common readout line, and the buffer drives the wiring, so that readout can be conducted at high speed. Furthermore, by means of making the buffer common to a plurality of memories, an increase in integration is possible.

The results of using such a circuit structure are clear. Commonly, one buffer must be assigned to each memory; however, by means of making the buffer common, a further increase in integration is possible when the circuit includes such a buffer. Furthermore, the output of the buffer is monitored by the control circuit during writing, and thereby, the effects of mistakes made during the manufacturing of the buffer can be eliminated.

Here, a source follower buffer having a CMOS structure was used as the buffer; however, this is not necessarily so limited, and there is no change in the effects of the present invention in so far as an amp having a low impedance output is employed. The reason for this is that the effects of the present invention comprise an increase in integration resulting from making the plurality of buffers common, and this does not depend on the type of buffer employed.

Fourth Embodiment

Figure 4:
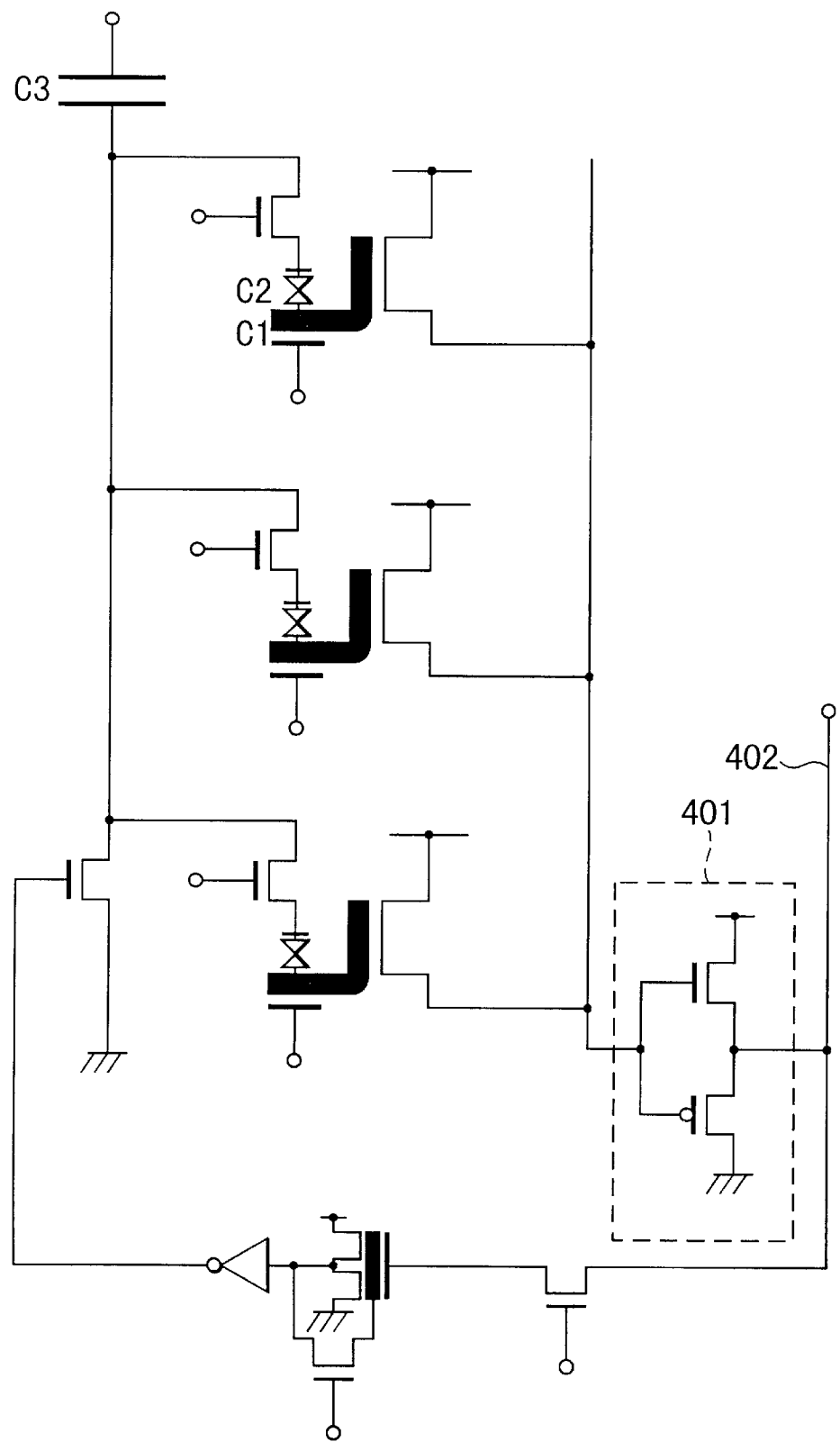
FIG. 4 is a circuit diagram relating to a fourth embodiment.

FIG. 4 shows a fourth embodiment. The points of difference are that a source follower buffer 401 having a CMOS structure is connected to the common readout voltage line 107 of the second embodiment, and the output 402 thereof is the common readout voltage terminal of the data.

The operation of this circuit will be explained. The selective writing is conducted in the same manner as in the second embodiment. The difference is that the voltage values which have passed through the buffer are sent to the control circuit during writing, and for this reason, a correct value which has absorbed the aberrations introduced during the manufacture of the buffer is written into the memory cell. For this reason, even if the characteristics of the buffer are aberrant, the correct value will be written without being affected thereby.

The selective readout is conducted in the same manner as in the second embodiment. The difference is that a buffer is connected to the common readout line, and since the buffer drives the wiring, readout is possible at high speed. Furthermore, as a result of making the buffer common to the plurality of memories, an increase in integration is possible.

The effects of using this circuit structure are clear. An increase in integration is possible for two reasons: as a result of the removal of the selection transistors, which is the effect of the second embodiment, and as a result of making common the buffer in the case of circuitry including a buffer, which is the effect of the third embodiment.

Here, a source follower buffer having a CMOS structure was employed as the buffer; however, this is not necessarily so limited, and there will be no change in the effect of the present invention as long as an amp having a low impedance output is employed. The reason for this is that the effects of the present invention comprise an increase in integration as a result of making the plurality of buffers common, and this is not dependent on the type of buffer employed.

Fifth Embodiment

Figure 5:
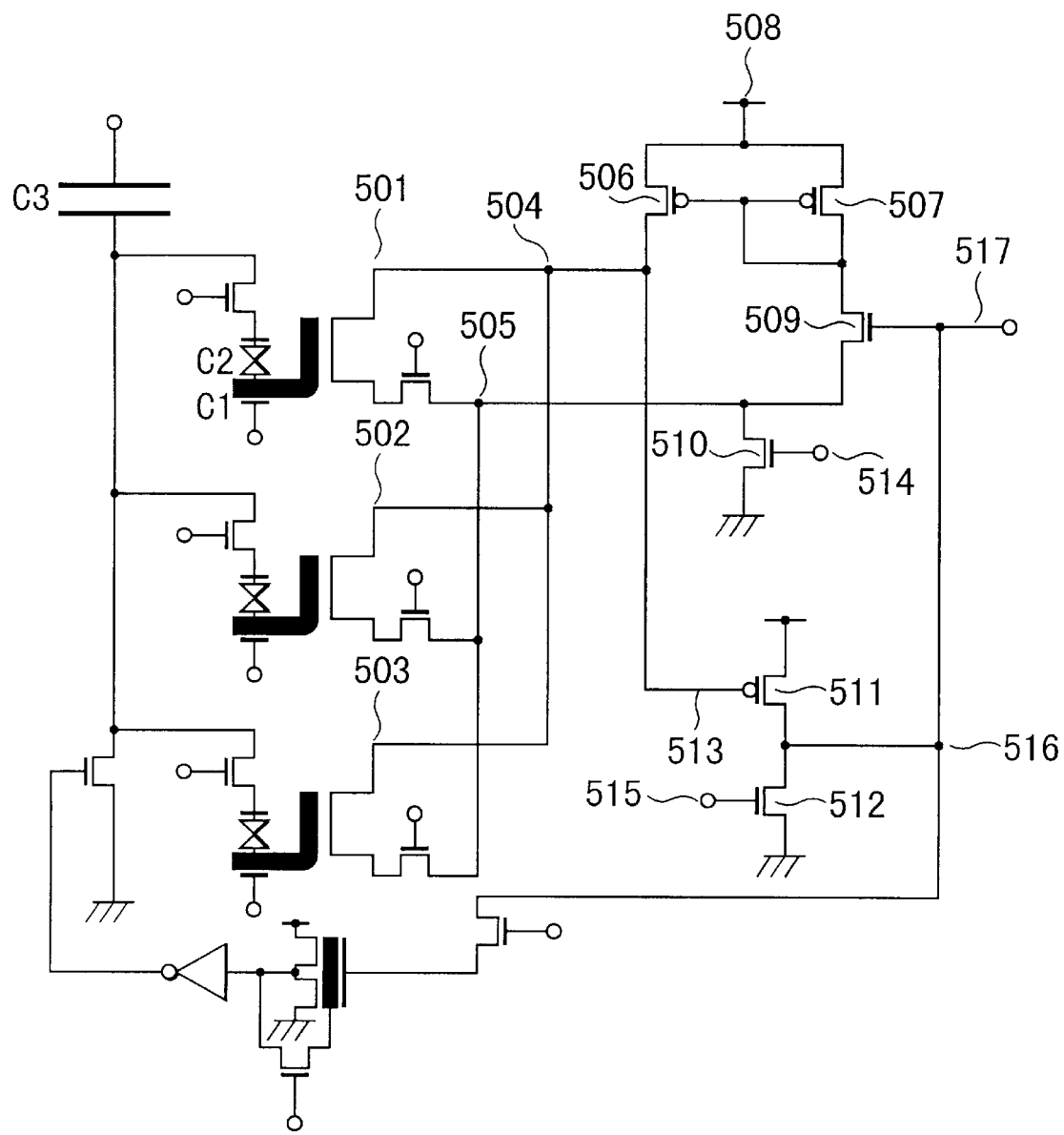
FIG. 5 is a circuit diagram relating to a fifth embodiment.

FIG. 5 shows a fifth embodiment. The drain terminals 501, 502, and 503 of the memory cell transistors of memory cells 114, 115, and 116 are commonly connected to terminal 504, and one terminal of readout selection transistors 106, 107, and 108 is connected in common to terminal 505. Two P channel transistors 506 and 507 form a current mirror circuit, and the source thereof is connected to power source 508. An N channel transistor 509 is connected to the drain terminal of transistor 507. Terminal 505 and the source side terminal of transistor 509 are made common, and these are connected to the drain side of n channel transistor 510, and furthermore, the source thereof is grounded. Terminal 504 is connected to the input 513 of an inversion amplifier formed by a P channel transistor 511 and an N channel transistor 512. Certain voltages are applied to the gate terminals 514 and 515 of transistors 510 and 512, and the setting is such that this operates as a constant current source. The output 516 of the inversion amplifier is connected to the gate of transistor 509, and this point forms the output 517 of the memory cell. Output 517 is connected to the input 122 of the control circuit via transistor 121.

Next, the operation of this circuit will be explained. The point of greatest difference with the first embodiment is the operation of the circuit comprising a plurality of transistors which is employed in readout. First, the operation of this circuit will be explained. When only cell 114 is read out, transistors 107 and 108 are placed in a non-conducting state, and the paths thereof are placed in a closed state. At this time, a differential amplifier is equivalently formed by transistors 101, 506, 507, 509, and 510, and the state is such that the gate of transistor 101, that is to say floating gate 102, and terminal 517 form the differential input terminal. The output 504 of the differential amplifier is connected to the input 513 of the inversion amplifier. That is to say, the circuit which is employed in readout has terminals 102 and 517 as inputs, and terminal 515 as an output, so that this is equivalent to the formation of a type of operational amplifier.

In this case, floating gate 102 serves as the non-inversion input terminal of the operational amplifier, while terminal 517 forms the inversion input terminal; the output 516 of the operational amplifier is connected to the inversion input terminal, so that the state is identical to the formation of a voltage follower having gate 102 as an input and terminal 517 as an output. Accordingly, the voltage written into floating gate 102 appears in an unchanged form in terminal 517.

The writing operation will now be explained. The readout selectivity during writing is identical to that of the first embodiment; this is conducted by placing transistor 106 in a conducting state, while transistors 107 and 108 are placed in a non-conducting state. The selective high voltage application during writing is also completely identical to that of the first embodiment. By applying a high voltage to terminal 117, writing is initiated. The value which is written passes through a voltage follower and appears in terminal 517. In exactly the same manner as in the first embodiment, then this value becomes equal to a reference value $V_{REF}$, the control circuit terminates writing, and this results the writing of $V_{TAR}$.

The readout operation may also be realized easily by controlling the ON and OFF state of each readout selection transistor 106, 107, and 108.

The effects of using this circuitry will now be explained. The readout portion comprises a voltage follower having a floating gate as an input, and thus it is possible to obtain all the advantages of a voltage follower as effects. That is to say, readout is realized in which no effects are exerted on the outputted value as a result of the thermal characteristics of the threshold value of the transistor, and it is possible to read out correct values irrespective of the operational temperature. Furthermore, a low impedance output can be realized, as in the third and fourth embodiments. Furthermore, as in the third and fourth embodiments, one buffer is provided for a plurality of memory cells, and thereby, it is possible to realize an increase in integration in the case of a circuit containing a buffer. Furthermore, with respect to offset errors caused by aberrations in the threshold value of the transistor of the differential input, which is commonly a problem with voltage followers, by inputting the output of the voltage follower into a control circuit during writing, correct values incorporating these errors can be written into the floating gate of the memory cell, so that readout mistakes are not generated as a result of offset errors.

In this way, in the fifth embodiment, a buffer having no thermal characteristics changes, termed a voltage follower, is combined with memory cells, and thereby, it is possible to realize an increase in integration as a result of making this buffer common, and it is possible to realize accurate readout.

In the present invention, in the readout circuit, a differential amplifier having an N channel transistor as input is equivalently provided in the first stage, while an inversion amplifier having a constant current source load is used in the second stage; however, the invention is not limited to this type of circuitry. It is clear that this is because the effects of the present invention are obtained by providing a state in which a voltage follower is equivalently formed by the operational amplifier when the contents of one memory cell are read out, so that this does not depend on the type of operational amplifier. For example, a differential amplification stage having a P channel transistor as an input in the input portion thereof may be employed, and furthermore, a differential amplifier stage having a constant resistance in place of the current mirror circuit may be employed. Furthermore, an operational amplifier employing a folded current mirror circuit may be used.

Sixth Embodiment

Figure 6:
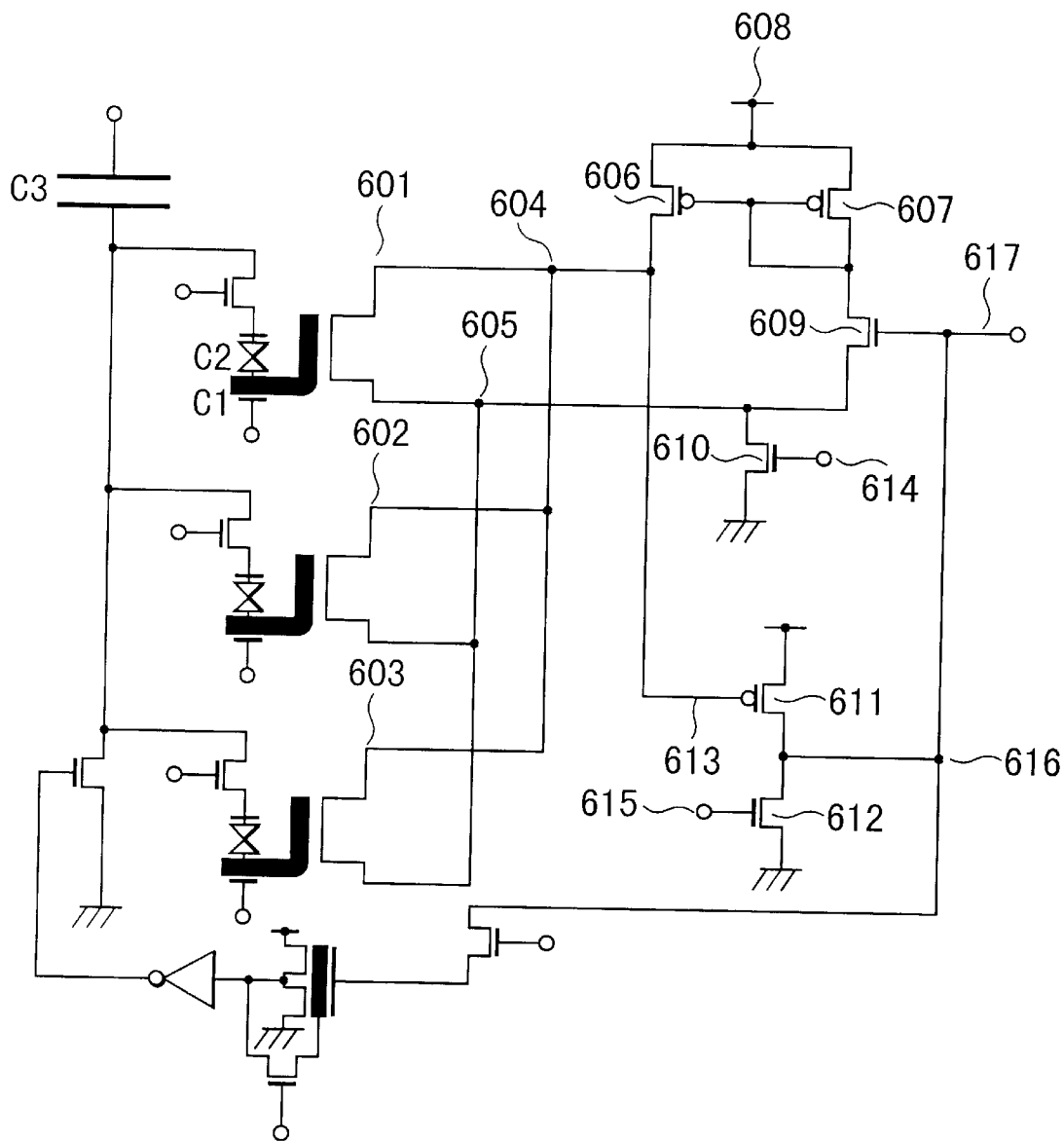
FIG. 6 is a circuit diagram relating to a sixth embodiment.

FIG. 6 shows a sixth embodiment. The difference between this embodiment and the fifth embodiment is that the readout selection transistors are omitted.

Next, the operation of this circuit will be explained. The operation of the circuit is similar to that of the circuit of the fifth embodiment. The difference is that readout selection is conducted by controlling the voltages of the electrodes 110, 201, and 202 provided in this cell, as in the second embodiment, without the use of readout selection transistor switches. The results of using this circuit structure are clearly similar to those of the second embodiment. By omitting the readout selection transistors which were conventionally necessary, it is possible to realize a reduction in the number of elements.

Seventh Embodiment

Figure 7:
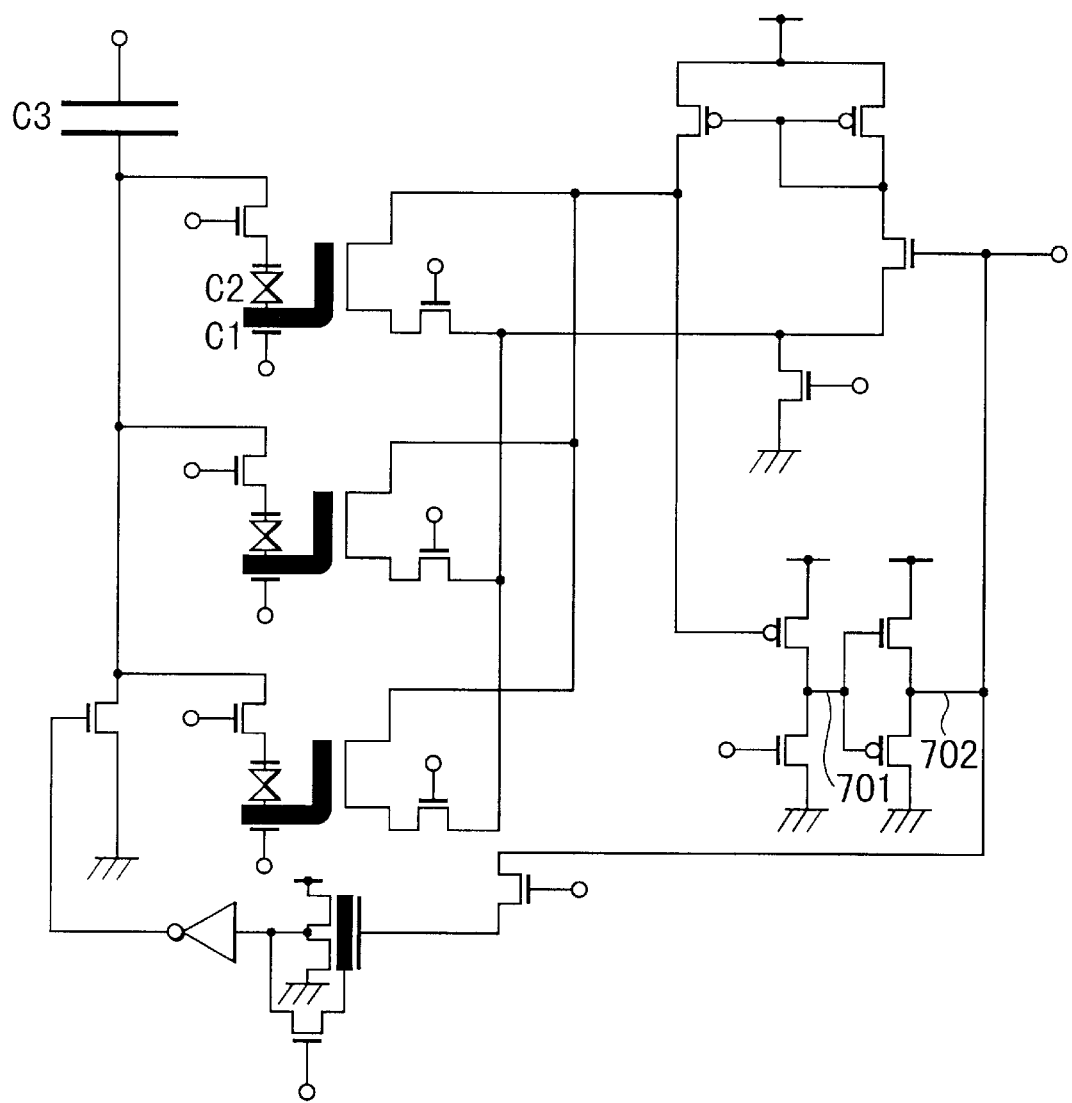
FIG. 7 is a circuit diagram relating to a seventh embodiment.

FIG. 7 shows a seventh embodiment. The difference between this embodiment and the fifth embodiment is that the output terminal 516 of the inversion amplifier is connected to the input 701 of a low impedance source follower buffer having a CMOS structure, and the output 702 thereof is connected to terminal 517.

Next, the operation of this circuit will be explained. The operation is similar to that of the circuit of the fifth embodiment. The difference is that the output of the operational amplifier is a low impedance output.

The effects of using this type of circuit structure are as follows. Since the output of the operational amplifier has a low impedance, the output of the voltage follower also has a low impedance. For this reason, high speed readout is possible which is resistant to noise.

In the present embodiment, in the readout circuit, a differential amplifier having an N channel transistor as an input was equivalently provided in the first stage, while a operational amplifier having an inversion amplifier possessing a phase current source load was employed in the second stage; however, the invention is not necessarily limited to such circuitry. The reason for this is that the effects of the present invention are obtained by creating a state in which a voltage follower is equivalently formed by a operational amplifier having a low impedance output when the contents of one memory cell are read out, and it is clear that these effects do not depend on the type of operational amplifier having a low impedance output which is employed.

Eighth Embodiment

Figure 8:
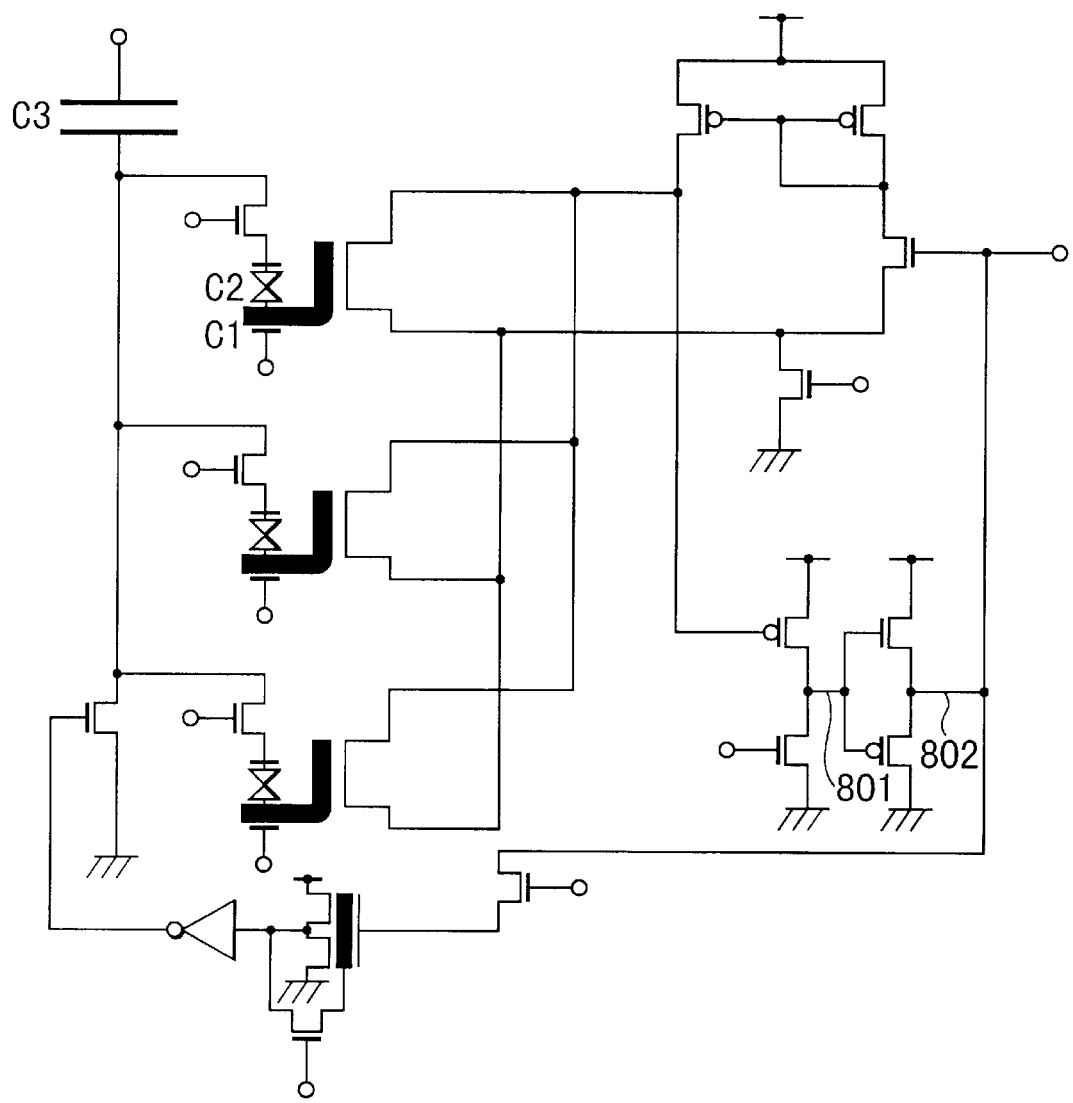
FIG. 8 is a circuit diagram relating to an eighth embodiment.
Figure 9:
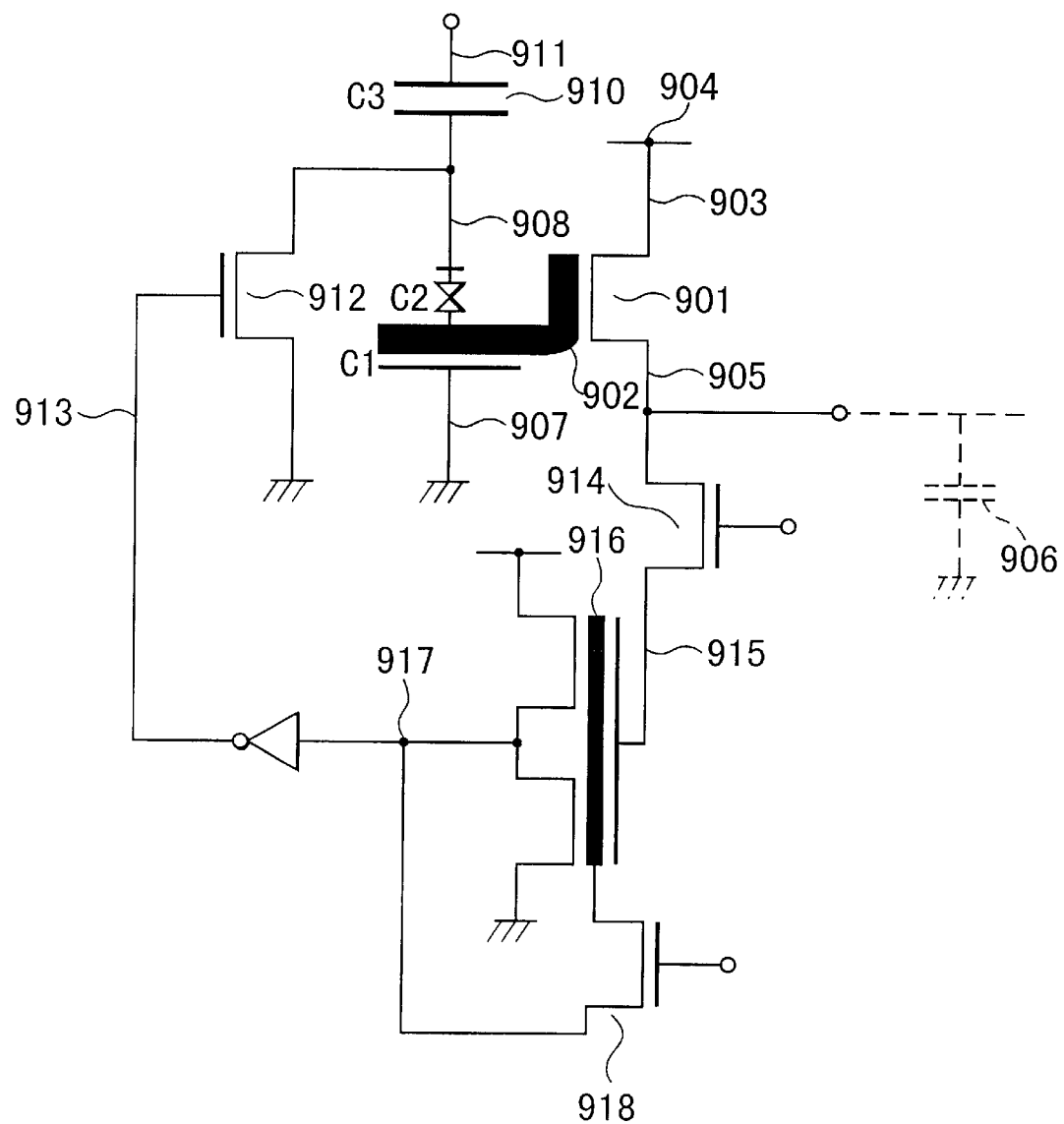
FIG. 9 is a circuit diagram relating to a related technology.
Figure 10:
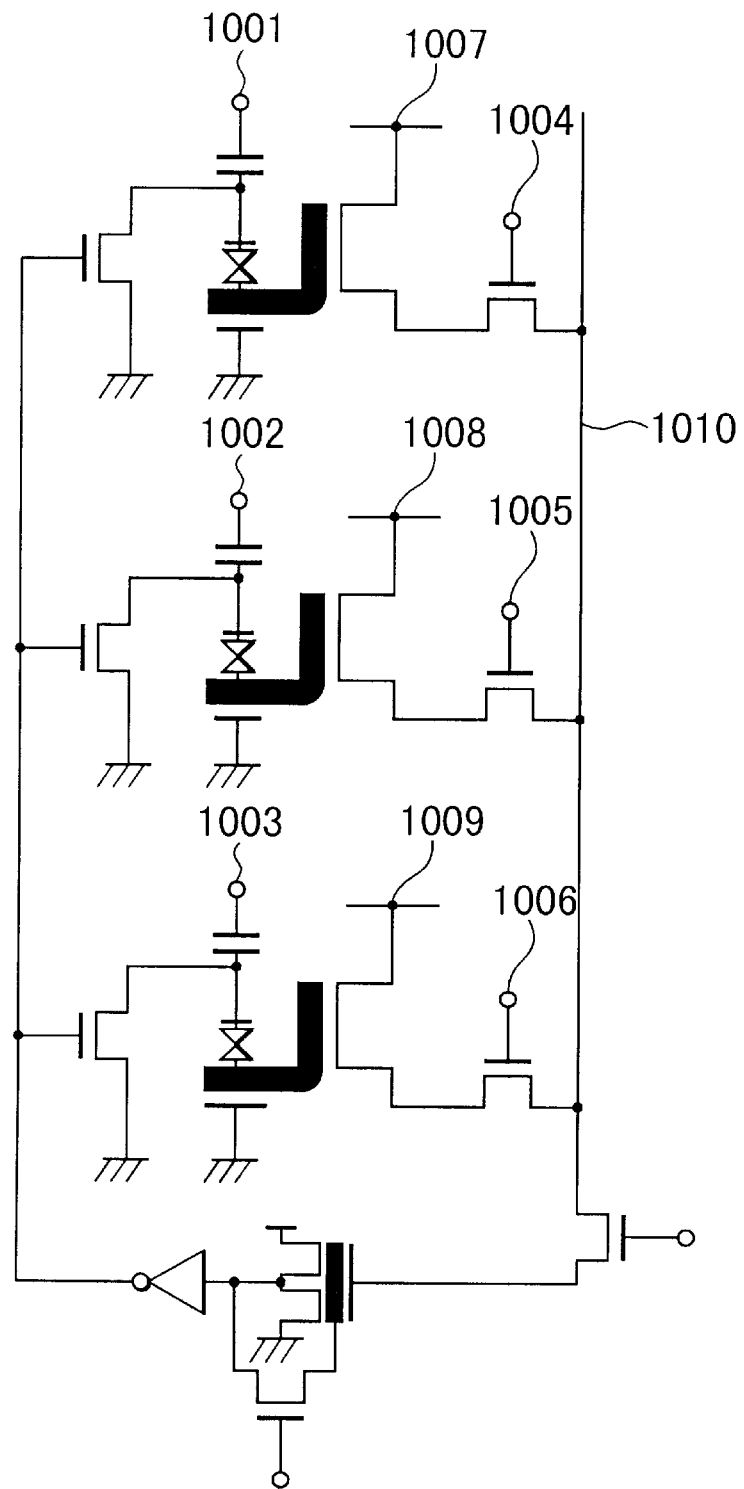
FIG. 10 is a circuit diagram relating to further related technology.
Figure 11:
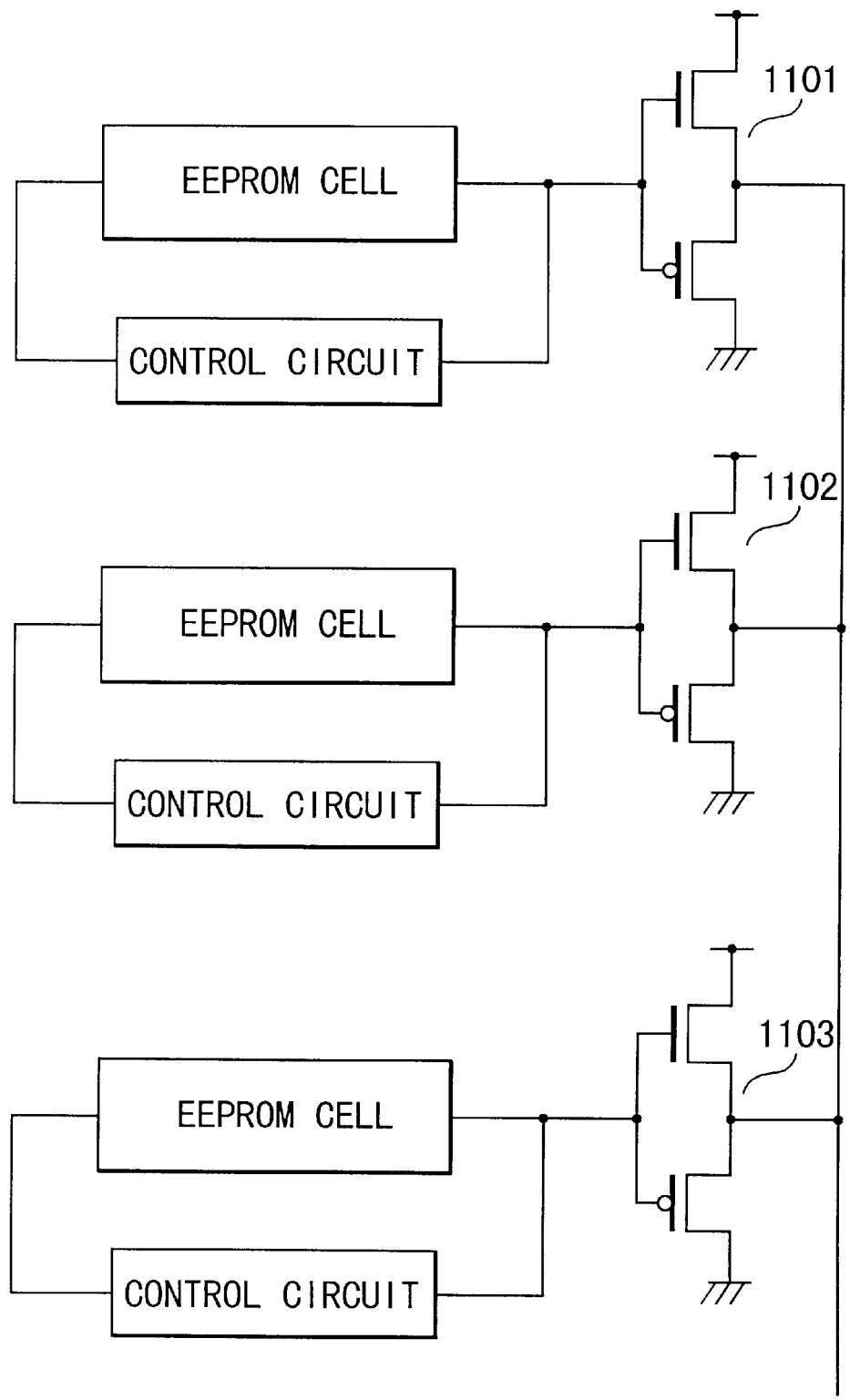
FIG. 11 is a circuit diagram relating to a related technology.

FIG. 8 shows an eighth embodiment. The difference between this embodiment and the seventh embodiment is that the readout selection transistors are omitted.

The operation of this circuit will be explained. The operation is similar to that of the circuit of the seventh embodiment. The difference is that readout selection is conducted by controlling the voltages of electrodes 110, 201, and 202 provided in the cells as in the second embodiment, without the use of readout selection transistor switches.

The effects of using this circuit structure are similar to those in the second embodiment and are clear. By means of omitting the readout selection transistors which were conventionally required, it is possible to realize a reduction in a number of elements.

INDUSTRIAL APPLICABILITY

By means of this circuit, an enormous increase in integration can be realized in comparison with conventional memories.

By means of employing the circuit described in claim 2 as the circuit which controls the switches, writing control can be conducted with an extremely small number of elements, and an increase in integration can be realized.

By means of employing a circuit such as that described in claim 3, signals can be inputted using terminals independent of the circuitry controlling the switches, and it is possible to realize a simplification of the peripheral circuitry.

By means of using circuitry such as that described in claim 4, the effects of aberrations in the inversion threshold values of the inventors can be ignored, and it is thus possible to ignore various causes of inaccuracy arising during circuit manufacture.

By means of using NMOS transistors as switches, circuits can be easily formed on the same substrate during semiconductor manufacture, and the same current can be caused to flow in a circuit surface area which is smaller than that in the case in which PMOS transistors are employed, so that an increase in integration can be realized.

By means of using PMOS transistors as the switches, it is possible to easily form circuitry on the same substrate during semiconductor circuit manufacture, and it is possible to form switches which are allowed to conduct when a voltage of 0 V is applied to one gate thereof, and switches can thus be realized which are capable of control at low voltages.

By using NMOS transistors as switches, it is easily possible to form the circuitry on the same substrate during semiconductor circuit manufacture, and it is possible to allow the same current to flow in a smaller circuit surface area in comparison with the case in which PMOS transistors are employed, so that it is possible to achieve a higher degree of integration.

By using PMOS transistors as switches, it is easily possible to form the circuitry on the same substrate during semiconductor circuit manufacture, and furthermore, it is possible to form switches which are made to conduct when a voltage of 0 V is applied to one of the gates thereof, so that switches can be realized which can be controlled with low voltages.

By means of using NMOS transistors as switches, it is easily possible to form the circuitry on the same substrate during semiconductor circuit manufacture, and furthermore, it is possible to form switches which are made to conduct when a voltage of DV is applied to one of the gates thereof, so that switches can be realized which can be controlled with low voltages.

By means of using NMOS transistors as switches, it is easily possible to form the circuitry on the same substrate during semiconductor circuit manufacture, and furthermore, it is possible to form switches which are made to conduct when a voltage of DV is applied to one of the gates thereof, so that switches can be realized which can be controlled with low voltages.

By means of using transmission gates as switches, it is possible to realize a higher degree of accuracy in voltage transmission, and it is possible to conduct control with a higher degree of accuracy.

In accordance with the present circuit, a much higher degree of integration can be achieved than was the case with conventional memories.

By means of using circuits such as those described in Claim eleven as the circuitry which controls the switches, writing control can be conducted with extremely few elements, and a higher degree of integration can be realized.

Using elements independent of the circuitry which controls the switches, it is possible to input a signal, and a simplification of the peripheral circuitry can be realized.

The effects of aberrations in the inversion threshold value of the inverter can be ignored, and it is possible to ignore various sources of inaccuracies arising during circuit manufacture.

By using NMOS transistors as switches, it is easily possible to form the circuitry on the same substrate during semiconductor circuit manufacture, and it is possible to allow the same current to flow in a smaller circuit surface area in comparison with the case in which PMOS transistors are employed, so that it is possible to achieve a higher degree of integration.

By using PMOS transistors as switches, it is easily possible to form the circuitry on the same substrate during semiconductor circuit manufacture, and furthermore, it is possible to form switches which are made to conduct when a voltage of 0 V is applied to one of the gates thereof, so that switches can be realized which can be controlled with low voltages.

By using NMOS transistors as switches, it is easily possible to form the circuitry on the same substrate during semiconductor circuit manufacture, and it is possible to allow the same current to flow in a smaller circuit surface area in comparison with the case in which PMOS transistors are employed, so that it is possible to achieve a higher degree of integration.

By using PMOS transistors as switches, it is easily possible to form the circuitry on the same substrate during semiconductor circuit manufacture, and furthermore, it is possible to form switches which are made to conduct when a voltage of 0 V is applied to one of the gates thereof, so that switches can be realized which can be controlled with low voltages.

By using NMOS transistors as switches, it is easily possible to form the circuitry on the same substrate during semiconductor circuit manufacture, and it is possible to allow the same current to flow in a smaller circuit surface area in comparison with the case in which PMOS transistors are employed, so that it is possible to achieve a higher degree of integration.

By using PMOS transistors as switches, it is easily possible to form the circuitry on the same substrate during semiconductor circuit manufacture, and furthermore, it is possible to form switches which are made to conduct when a voltage of 0 V is applied to one of the gates thereof, so that switches can be realized which can be controlled with low voltages.

By means of using transmission gates as switches, it is possible to realize a higher degree of accuracy in voltage transmission, and it is possible to conduct control with a higher degree of accuracy.

By means of providing a common low impedance buffer for a plurality of memory cells, it is possible to achieve high speed readout, and a higher degree of integration can be realized than in the case in which a low impedance buffer is provided for each memory cell.

By using a source follower having a push-pull structure structured in a complementary manner using a PMOS transistor and an NMOS transistor as the low impedance buffer, it is possible to manufacture this in the same manufacturing process as that of the memory cell.

By means of using a circuit such as that described in claim 25 as the circuit which controls the switches, it is possible to conduct writing control using extremely few elements, and a high degree of integration can be realized.

By means of using a circuit such as that described in claim 26, it is possible to input signals using a terminal independent of the circuit which control the switches, and it is possible to realize a simplification of the peripheral circuitry.

By means of using a circuit such as that described in claim 27, it is possible to ignore the effects of aberrations in the inversion threshold value of the inverter, and it becomes possible to ignore various sources of inaccuracies arising during circuit manufacture.

By means of providing a common low impedance buffer for a plurality of memory cells, it is possible to achieve high speed readout, and a higher degree of integration can be realized than in the case in which a low impedance buffer is provided for each memory cell.

By using a source follower having a push-pull structure structured in a complementary manner using a PMOS transistor and an NMOS transistor as the low impedance buffer, it is possible to manufacture this in the same manufacturing process as that of the memory cell.

By means of using a circuit such as that described in claim 30 as the circuit which controls the switches, it is possible to conduct writing control using extremely few elements, and a high degree of integration can be realized.

By means of using a circuit such as that described in claim 31, it is possible to input signals using a terminal independent of the circuit which control the switches, and it is possible to realize a simplification of the peripheral circuitry.

By means of using a circuit such as that described in claim 32, it is possible to ignore the effects of aberrations in the inversion threshold value of the inverter, and it becomes possible to ignore various sources of inaccuracies arising during circuit manufacture.

By providing a common buffer for a plurality of memory cells, it is possible to realize high speed readout, and furthermore, by causing this buffer to conduct a source follower operation of an operational amplifier, readout and writing which is resistant to noise and drift can be realized.

By means of using a circuit such as that described in claim 34 as the circuit which controls the switches, it is possible to conduct writing control using extremely few elements, and a high degree of integration can be realized.

By means of using a circuit such as that described in claim 35, it is possible to input signals using a terminal independent of the circuit which controls the switches, and it is possible to realize a simplification of the peripheral circuitry.

By means of using a circuit such as that described in claim 36, it is possible to ignore the effects of aberrations in the inversion threshold value of the inverter, and it becomes possible to ignore various sources of inaccuracies arising during circuit manufacture.

By providing a common buffer for a plurality of memory cells, it is possible to realize high speed readout, and furthermore, by causing this buffer to conduct a source follower operation of an operational amplifier, readout and writing which is resistant to noise and drift can be realized.

By means of using a circuit such as that described in claim 38 as the circuit which controls the switches, it is possible to conduct writing control using extremely few elements, and a high degree of integration can be realized.

By means of using a circuit such as that described in claim 39, it is possible to input signals using a terminal independent of the circuit which controls the switches, and it is possible to realize a simplification of the peripheral circuitry.

By means of using a circuit such as that described in claim 40, it is possible to ignore the effects of aberrations in the inversion threshold value of the inverter, and it becomes possible to ignore various sources of in accuracies arising during circuit manufacture.

While this invention has been described as having a preferred design, the present invention can be further modified within the spirit and scope of this disclosure. This application is therefore intended to cover any variations, uses, or adaptations of the invention using its general principles. Further, this application is intended to cover such departures from the present disclosure as come within known or customary practice in the art to which this invention pertains and which fall within the limits of the appended claims.

What is claimed is:

1. A nonvolatile semiconductor memory device comprising:

two or more semiconductor devices each having a first MOS transistor having a source and having a first floating gate which is electrically insulated;
a first electrode capacitively coupled with the first floating gate;
a second electrode provided at said first floating gate via a tunnel junction; and
a third electrode connected with said second electrode via a switch; wherein a fourth electrode connected commonly with said third electrode of said semiconductor devices;
a fifth electrode connected commonly to source of the first MOS transistor;
a sixth electrode capacitively coupled with said fourth electrode; and
a seventh electrode connected to said fourth electrode via a switch.

2. A nonvolatile semiconductor memory device in accordance with claim 1 comprising an inverter circuit, wherein the ON and OFF state of said fourth and seventh electrodes is controlled by an output signal, or by a signal resulting from passing an output signal through a pre-specified number of inverter stages, of said inverter circuit constructed using at least one other MOS transistor, the ON and OFF state of said other MOS transistor controlled by a second floating gate which is capacitively coupled with an eighth electrode connected with said fifth electrode via a switch.

3. A nonvolatile semiconductor memory device in accordance with claim 2 including a signal line, wherein the second floating gate is connected to said signal line via a switch.

4. A nonvolatile semiconductor memory device in accordance with claim 2 including a second inverter circuit with an output terminal, wherein said second floating gate is connected via a switch with said output terminal of said second inverter circuit constructed using at least one other MOS transistor.

5. A nonvolatile semiconductor memory device in accordance with claim 2 wherein NMOS transistors are used as switches connecting said second and third electrodes.

6. A nonvolatile semiconductor memory device in accordance with claim 2 wherein PMOS transistors are used as switches connecting said second and third electrodes.

7. A nonvolatile semiconductor memory device in accordance with claim 2 wherein NMOS transistors are used as switches connecting said fourth and seventh electrodes.

8. A nonvolatile semiconductor memory device in accordance with claim 2 wherein PMOS transistors are used as switches connecting said fourth and seventh electrodes.

9. A nonvolatile semiconductor memory device in accordance with claim 2 wherein NMOS transistors are used as switches connecting said fifth and eighth electrodes.

10. A nonvolatile semiconductor memory device in accordance with claim 2 wherein PMOS transistors are used as switches connecting said fifth and eighth electrodes.

11. A nonvolatile semiconductor memory device in accordance with claim 2 including transmission gates constructed in a complementary manner using one PMOS transistor and one NMOS transistor are used as said switches connecting said fifth and eighth electrodes.

12. A nonvolatile semiconductor memory device comprising:

two or more semiconductor devices each including:
a MOS transistor having a source and having a first floating gate which is electrically insulated;
a first electrode capacitively coupled with said first floating gate;
a second electrode provided at said first floating gate via a tunnel junction;
a third electrode connected to said second electrode via a switch; and
a fourth electrode connected to said source of said MOS transistor via a switch;
wherein are provided a fifth electrode which is commonly connected to said third electrode of the semiconductor devices;
a sixth electrode which is commonly connected to said fifth electrode;
a seventh electrode which is capacitively coupled with said fifth electrode; and
an eighth electrode which is connected with said fifth electrode via a switch.

13. A nonvolatile semiconductor memory device in accordance with claim 12 including an inverter circuit and wherein the ON and OFF state of said fifth electrode and said eighth electrode are controlled by an output signal, or by a signal resulting from passing said output signal through a prescribed number of inverter stages, of said inverter circuit constructed using at least one other MOS transistor, the ON and OFF state of which is controlled by a second floating gate capacitively coupled with a ninth electrode which is connected with said sixth electrode via a switch.

14. A nonvolatile semiconductor memory device in accordance with claim 13 includes a signal line and wherein said second floating gate is connected to said signal line via a switch.

15. A nonvolatile semiconductor memory device in accordance with claim 13 wherein said second floating gate is connected via a switch to an output terminal of said inverter circuit constructed using at least one other MOS transistor.

16. A nonvolatile semiconductor memory device in accordance with claim 13 wherein an NMOS transistor is used as the switch connecting said second and third electrodes.

17. A nonvolatile semiconductor memory device in accordance with claim 13 wherein a PMOS transistor is used as the switch connecting said second and third electrodes.

18. A nonvolatile semiconductor memory device in accordance with claim 13 wherein an NMOS transistor is used as the switch connecting said fifth and eighth electrodes.

19. A nonvolatile semiconductor memory device in accordance with claim 13 wherein a PMOS transistor is used as the switch connecting said fifth and eighth electrodes.

20. A nonvolatile semiconductor memory device in accordance with claim 13 wherein an NMOS transistor is used as the switch connecting said sixth and seventh electrodes.

21. A nonvolatile semiconductor memory device in accordance with claim 13 wherein a PMOS transistor is used as the switch connecting said sixth and seventh electrodes.

22. A nonvolatile semiconductor memory device in accordance with claim 13 wherein a transmission gate is constructed in a complementary manner using a PMOS transistor and an NMOS transistor and used as a switch connecting said sixth and ninth electrodes.

23. A nonvolatile semiconductor memory device comprising:

two or more semiconductor devices including:
a MOS transistor having a source and having a first floating gate which is electrically insulated;
a first electrode which is capacitively coupled with said first floating gate;

a second electrode provided at said first floating gate via a tunnel junction; and a third electrode which is connected with said second electrode via a switch; wherein are provided:

a fourth electrode which is commonly connected with said third electrode of the semiconductor devices;

a fifth electrode which is commonly connected with the source of said MOS transistor;

a sixth electrode which is capacitively coupled with said fourth electrode;

a seventh electrode which is connected with said fourth electrode via a switch; and an eighth electrode which is connected with said fifth electrode via a buffer circuit having a low impedance output.

24. A nonvolatile semiconductor memory device in accordance with claim 23, including a source follower having a push-pull structure constructed in a complementary manner using a PMOS transistor and an NMOS transistor employed as a buffer having a low impedance output which connects said fifth and eighth electrodes.

25. A nonvolatile semiconductor memory device in accordance with claim 24, including an inverter circuit, wherein the ON/OFF state of the fourth and seventh electrodes is controlled by an output signal, or by a signal resulting from passing said output signal through a predetermined number of inverter stages, of said inverter circuit constructed using at least one other MOS transistor, the ON/OFF state of which is controlled by a second floating gate which is capacitively coupled with a ninth electrode which is connected to said eighth electrode via a switch.

26. A nonvolatile semiconductor memory device in accordance with claim 24 including a signal line, wherein said second floating gate is connected to said signal line via a switch.

27. A nonvolatile semiconductor memory device in accordance with claim 24, wherein said second floating gate is connected via a switch to an output terminal of said inverter circuit constructed using at least one other MOS transistor.

28. A nonvolatile semiconductor memory device comprising:

two or more semiconductor devices including:

an MOS transistor having a source and having a first floating gate which is electrically insulated;

a first electrode which is capacitively coupled with said first floating gate;

a second electrode provided at said first floating gate via a tunnel junction;

a third electrode connected to said second electrode via a switch; and a fourth electrode connected with the source of said MOS transistor via a switch; wherein are provided:

a fifth electrode commonly connected with said third electrode of the semiconductor devices;

a sixth electrode commonly connected with said fourth electrode;

a seventh electrode capacitively coupled with said fourth electrode;

an eighth electrode connected with said fourth electrode via a switch; and a ninth electrode connected with said sixth electrode via a buffer circuit having a low impedance output.

29. A nonvolatile semiconductor memory device in accordance with claim 28, wherein a source follower having a push-pull structure structured in a complementary manner using a PMOS transistor and an NMOS transistor is used as said buffer circuit having a low impedance output which connects said sixth and ninth electrodes.

30. A nonvolatile semiconductor memory device in accordance with claim 29, including an inverter circuit, wherein the ON/OFF states of said fourth and eighth electrodes are controlled by an output signal, or by a signal resulting from passing said output signal through a prescribed number of inverter stages, of said inverter circuit constructed using at least one other MOS transistor, the ON/OFF state of which is controlled by a second floating gate which is capacitively coupled with a tenth electrode connected to said ninth electrode via a switch.

31. A nonvolatile semiconductor memory device in accordance with claim 30 wherein said second floating gate is connected to a signal line via a switch.

32. A nonvolatile semiconductor memory device in accordance with claim 29 wherein said second floating gate is connected via a switch to an output terminal of said inverter circuit constructed using at least one other MOS transistor.

33. A nonvolatile semiconductor memory device comprising:

at least two semiconductor devices each including:

a MOS transistor having a source, a drain and having a first floating gate which is electrically insulated;

a first electrode which is capacitively coupled with said first floating gate;

a second electrode which is provided at said first floating gate via a tunnel junction; and a third electrode which is coupled with said second electrode via a switch; wherein are provided:

a fourth electrode which is commonly connected to said third electrode of the semiconductor devices;

a fifth electrode which is commonly connected to the source of said MOS transistor;

a sixth electrode which is commonly connected to the drain of said MOS transistor;

a first operational amplifier; and wherein the source of said MOS transistor receives a non-inversion input of said first operational amplifier is connected to said fifth electrode, while the drain thereof is connected to said sixth electrode, an inversion input of said first operational amplifier is connected to an output of said first operational amplifier, and said fifth electrode is capacitively coupled with said fourth electrode, and said sixth electrode, said fifth electrode connected via a switch with said fourth electrode.

34. A nonvolatile semiconductor memory device in accordance with claim 33, including an inverter circuit and wherein the ON/OFF states of said fourth and sixth electrodes are controlled by an output signal, or by a signal resulting from passing the output signal through a predetermined number of inverter stages, of said inverter circuit constructed using at least one other MOS transistor, the ON/OFF state of which is controlled by a second floating gate which is capacitively coupled with a seventh electrode, which is connected by a switch with the output of said first operational amplifier.

35. A nonvolatile semiconductor memory device in accordance with claim 34, wherein said second floating gate is connected to a signal line via a switch.

36. A nonvolatile semiconductor memory device in accordance with claim 34, wherein said second floating gate is connected via a switch to an output terminal of said inverter circuit constructed using at least one other MOS transistor.

37. A nonvolatile semiconductor memory device comprising:

two or more semiconductor devices each including:
- a MOS transistor having a source, a drain and having a first floating gate which is electrically insulated;
- a first electrode capacitively coupled with said first floating gate;
- a second electrode provided at said first floating gate via a tunnel junction;
- a third electrode coupled with said second electrode via a switch; and
- a fourth electrode connected to the source of said MOS transistor via a switch; wherein a fifth electrode commonly connected to said third electrode of the semiconductor devices;

a sixth electrode commonly connected to said fourth electrode;

a first operational amplifier; and a seventh electrode commonly connected to the drain of said MOS transistor, and wherein the source of said MOS transistor receives a non-inversion input of said first operational amplifier and is connected to said sixth electrode, while the drain thereof is connected to said seventh electrode, and an inversion input of said first operational amplifier is connected to an output of said first operational amplifier, and said seventh electrode is capacitively coupled with said fifth electrode, and said sixth electrode, which is also connected via a switch with said fifth electrode.

38. A nonvolatile semiconductor memory device in accordance with claim 37, including an inverter circuit, wherein the ON/OFF state of said fifth and sixth electrodes are controlled by an output signal, or by a signal resulting from passing an output signal through a pre-specified number of inverter stages, of said inverter circuit constructed using at least one other MOS transistor, the ON/OFF state of which is controlled by a second floating gate capacitively coupled with an eighth electrode, which is connected to the output of said first operational amplifier via a switch.

39. A nonvolatile semiconductor memory device in accordance with claim 38, including a signal line, wherein said second floating gate is connected to said signal line via a switch.

40. A nonvolatile semiconductor memory device in accordance with claim 38, wherein said second floating gate is connected via a switch with an output terminal of said inverter circuit constructed using at least one other MOS transistor.

* * * * *